US009955260B2

(12) United States Patent
Button

(10) Patent No.: US 9,955,260 B2
(45) Date of Patent: Apr. 24, 2018

(54) ASYMMETRICAL PASSIVE GROUP DELAY BEAMFORMING

(71) Applicant: Harman International Industries, Inc., Stamford, CT (US)

(72) Inventor: Douglas J. Button, Simi Valley, CA (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 15/164,297

(22) Filed: May 25, 2016

(65) Prior Publication Data

US 2017/0347191 A1 Nov. 30, 2017

(51) Int. Cl.

| | |
|---|---|
| ***H03G 5/00*** | (2006.01) |
| ***H04R 3/14*** | (2006.01) |
| ***H04R 1/32*** | (2006.01) |
| ***H04R 3/04*** | (2006.01) |

(52) U.S. Cl.

CPC ............... *H04R 3/14* (2013.01); *H04R 1/323* (2013.01); *H04R 3/04* (2013.01); *H04R 2201/403* (2013.01); *H04R 2203/12* (2013.01)

(58) Field of Classification Search

CPC ............ H04R 3/14; H04R 1/323; H04R 3/04; H04R 2201/403; H04R 2203/12

USPC ....... 381/63, 89, 97, 99, 111, 160, 335, 336, 381/77, 79, 80, 81, 182, 387; 367/137, 367/138

See application file for complete search history.

(56) References Cited

U.S. PATENT DOCUMENTS

| | | | |
|---|---|---|---|
| 1,643,323 | A | 9/1927 | Stone |
| 3,068,431 | A | 12/1962 | Watts, Jr. |
| 3,125,181 | A | 3/1964 | Pawlowski |
| 3,299,206 | A | 1/1967 | Klepper |
| 4,015,089 | A | 3/1977 | Ishii et al. |
| 4,330,691 | A | 5/1982 | Gordon |
| 4,845,759 | A | 7/1989 | Danley |
| 5,233,664 | A | 8/1993 | Yanagawa et al. |

(Continued)

FOREIGN PATENT DOCUMENTS

| | | | |
|---|---|---|---|
| EP | 0065810 | A2 | 12/1982 |
| WO | 02071796 | A1 | 9/2002 |

OTHER PUBLICATIONS

JBL Professional, "CBT Constant Beamwidth Technology", Technical Notes vol. 1, No. 35, Oct. 2009, 22 pgs.

(Continued)

*Primary Examiner* — Vivian Chin
*Assistant Examiner* — Friedrich W Fahnert
(74) *Attorney, Agent, or Firm* — Brooks Kushman, P.C.

(57) ABSTRACT

A loudspeaker configured to provide asymmetrical beam coverage. A first group of drivers to outputs a first beam pattern. A second group of drivers, which is different from the first group of drivers, is configured to output a second beam pattern. A transmission line is adapted to output signals to the first driver group and the second driver group to provide an asymmetrical beam pattern. The first driver group outputs a beam pattern different than the second driver group. This can improve acoustic coverage, e.g., sound pressure levels, in the acoustic environment. In an example, the transmission line is separated into two distinct parts that feeds the first driver group and the second driver group respectively.

19 Claims, 10 Drawing Sheets

(56) References Cited

U.S. PATENT DOCUMENTS

| | | | | |
|---|---|---|---|---|
| 5,781,645 | A * | 7/1998 | Beale | H04R 3/12 381/300 |
| 6,128,395 | A * | 10/2000 | De Vries | H04R 1/403 381/182 |
| 6,584,202 | B1 | 6/2003 | Montag et al. | |
| 7,260,235 | B1 | 8/2007 | Henricksen et al. | |
| 8,351,616 | B1 * | 1/2013 | Graber | H04R 1/403 381/89 |
| 2002/0131608 | A1 | 9/2002 | Lobb et al. | |
| 2002/0187763 | A1 | 12/2002 | Lim et al. | |
| 2004/0240697 | A1 | 12/2004 | Keele, Jr. | |
| 2005/0089178 | A1 | 4/2005 | Asada et al. | |
| 2005/0141735 | A1 | 6/2005 | Kim | |
| 2005/0207588 | A1 | 9/2005 | Biegelsen | |
| 2008/0212805 | A1 | 9/2008 | Fincham | |
| 2009/0060236 | A1 * | 3/2009 | Johnston | H04R 3/12 381/304 |
| 2013/0034251 | A1 * | 2/2013 | Fincham | H03G 3/004 381/160 |
| 2013/0272557 | A1 * | 10/2013 | Ozcan | G06F 1/1637 381/333 |
| 2013/0336505 | A1 * | 12/2013 | Button | H04R 3/12 381/303 |
| 2015/0312693 | A1 * | 10/2015 | Collins | H04S 7/30 381/300 |
| 2016/0080026 | A1 | 3/2016 | Hoirup et al. | |
| 2017/0005640 | A1 * | 1/2017 | Hidri | H03M 1/1215 |

OTHER PUBLICATIONS

Novak, James, A Column Loudspeaker With Controlled Coverage Angle, May 25, 1962, 8 pgs.

Keele, Jr. D. B., "Implementation of Straight-Line and Flat-Panel Constant Beamwidth Transducer (CBT) Loudspeaker Arrays Using Signal elays", Audio Engineering Society, Convention Paper, Oct. 5-8, 2002, 29 pgs.

Klepper, D. L. et al., "Constant Directional Characteristics from a Line Source Array", Journal of the Audio Engineering Society, Jul. 1963, vol. 11, No. 3, 5 pgs.

International Search Report dated Aug. 24, 2017 for PCT/US2017/034481.

* cited by examiner

ASYMMETRICAL PASSIVE GROUP DELAY BEAMFORMING

TECHNICAL FIELD

Aspects of the present disclosure provide for systems and methods for asymmetrical passive group delay beamforming, for example, for a loudspeaker system.

BACKGROUND

Loudspeaker systems have been implemented as arrays of loudspeakers, or drivers; stacked and aligned vertically, aligned horizontally, or in two dimensions. The drivers in such configurations may be of the same type, such as tweeters, midrange speakers, or wideband speakers. The drivers may also be connected to cross-over networks, or filters to generate sound in particular frequency ranges.

One problem with loudspeaker systems arranged in an array is that the sound generated by multiple drivers does not create a consistent sound field or pattern. This inconsistency in the sound field or pattern distorts the sound and impairs the listening experience of the listener.

SUMMARY

A loudspeaker can include structures to produce at least two beam patterns from the loudspeaker. The loudspeaker can include a first group of drivers to output a first beam pattern and a second group of drivers that are different from the first group of drivers, wherein the second group of drivers is configured to output a second beam pattern. A first transmission line circuit controls input to the first group of drivers. A second transmission line circuit controls input to the first group of drivers. The second transmission line circuit is different from the first transmission line circuit. The transmission line circuits are tapped at various locations to feed a signal to drivers in either the first group or the second group.

In an example, the first transmission line circuit includes a plurality of sub-circuit stages corresponding to a number of the first group of drivers.

In an example, the second transmission line circuit includes a plurality of sub-circuit stages corresponding to a number of the second group of drivers.

In an example, the sub-circuit stages are programmable to control a delay or other signal processing.

In an example, at least one of the sub-circuit stages includes a plurality of circuit elements that are selectively conducting to program the sub-circuit stage.

In an example, the at least one of the sub-circuit stages includes a switch that selectively electrically connects at least one of the plurality of circuit elements to provide a select delay or signal processing.

In an example, the plurality of circuit elements includes only passive elements.

In an example, the first transmission line includes a plurality of processing stages corresponding to a number of the first group of drivers.

In an example, the second transmission line includes a plurality of delay stages corresponding to a number of the second group of drivers.

In an example, the processing stages are programmable to control a processing of the audio input signal delay.

In an example, at least one of the processing stages includes a plurality of circuit elements that are selectively conducting to program the processing of the processing stage.

In an example, the at least one of the processing stages includes a switch that selectively electrically connects at least one of the plurality of circuit elements to provide a select signal processing for a respective one of the drivers.

A loudspeaker array can include a first group of drivers to output a first beam pattern and a second group of drivers that are different from the first group of drivers, wherein the second group of drivers is configured to output a second beam pattern. A first transmission line includes a first plurality of stages connected to the first group of drivers. Each stage has an input and an output. The stage output of each stage can be coupled to the stage input of a next stage and to at least one of the plurality of drivers. The stage input of a first stage can be coupled to an audio signal input. In an example, each stage includes an LC branch where at least one inductor is in series with the stage input and the stage output. The at least one capacitor is connected to the stage output in parallel with the at least one of the plurality of drivers of the first group.

In an example, a second transmission line includes a second plurality of stages connected to the second group of drivers. Each stage having a stage input and a stage output. The stage output of each stage is coupled to the stage input of a next stage and to at least one of the plurality of drivers. The stage input of a first stage being coupled to an audio signal input. Each stage includes an LC branch with at least one inductor in series with the stage input and the stage output and at least one capacitor connected to the stage output in parallel with the at least one of the plurality of drivers of the second group.

In an example, each stage of the first plurality of stages and the second plurality of stages being configured to add an electrical delay to each subsequent stage, the electrical delay being adjusted such that the plurality of first and second plurality of drivers generate sound in a desired radiation pattern that is the sum of the first beam pattern and the second beam pattern.

In an example, the first group of drivers is arranged in a first linear array includes a first driver positioned at an end of the first linear array that receives an input signal from the first transmission line that is not affected by a stage of the first transmission line.

In an example, the second group of drivers is arranged in a second linear array having a second driver positioned at an end of the second linear array that receives an input signal from the first transmission line that is not affected by a stage of the second transmission line.

In an example, the first driver and the second driver are remote from each other.

In an example, the first driver and the second driver are adjacent at a middle of the loudspeaker array.

In an example, component values for each stage are selected to adjust electrical delay of the input signal to drivers of the first group of drivers and of the second group of drivers.

In an example, the first beam pattern is configured to provide sound to a top of an environment above the loudspeaker array. The second beam pattern is configured to provide sound to an environment below the loudspeaker array.

In an example, the first beam pattern is a narrow beam and the second beam pattern is a wide beam pattern, wider than the narrow beam of the first beam pattern.

In an example, the desired radiation pattern is controlled by the first beam pattern in a first volume of a loudspeaker environment, e.g., above the loudspeaker array, and by the second beam pattern in a second volume of the loudspeaker environment, e.g., below the loudspeaker array.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

Figure 1:
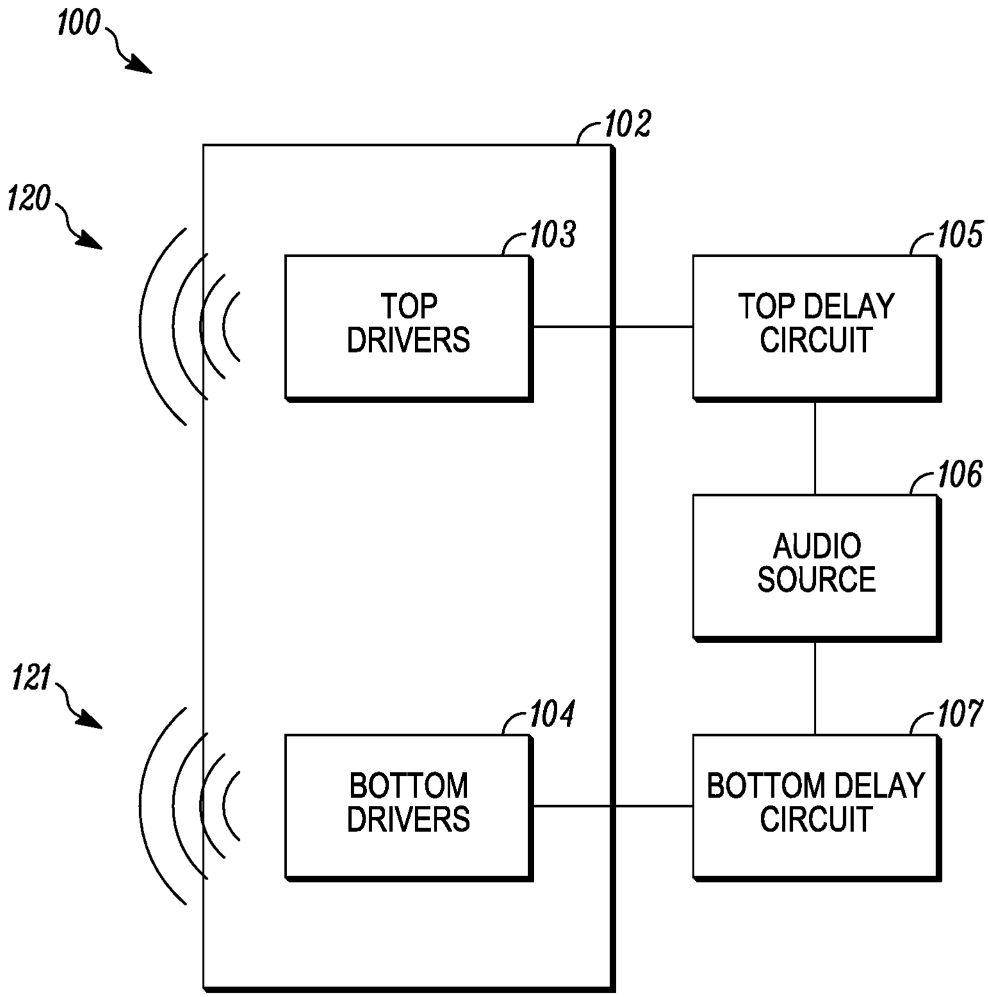
FIG. 1 shows a schematic view of an audio system according to an embodiment.

The present disclosure is provided in the context of the loudspeaker systems, and, more particularly, to controlling the beams to form asymmetrical beams. The loudspeaker can provide asymmetrical beam coverage patterns, which can be selected and optionally programmed. The selection of the beam coverage pattern can be different from other beam coverage patterns produced by the loudspeaker. The beam coverage patterns can be different for different groups of drivers in the loudspeaker. An individual feed circuit (e.g., a multiple stage circuit, a delay network, or a transmission line) can control the beam pattern for each group of drivers in the loudspeaker. The feed circuit may have an individual circuit stage, e.g., a delay stage, for each driver. The delay stages may be different from each other and programmable, e.g., by selecting the circuit elements that are active in the individual stages.

Detailed embodiments are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

The embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical/operational implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and instructions (e.g., software) which co-act with one another to perform operation(s) disclosed herein. In addition, any one or more of the electric devices may be configured to execute a computer-program that is embodied in a computer readable medium that is programmed to perform any number of the functions and features as disclosed. The computer readable medium may be non-transitory or in any form readable by a machine or electrical component. For ease of description the various circuit elements may not be described in detail but are part of the structural elements described. Examples of structural elements that include circuitry include the echo canceller, microphones, filters, amplifiers and communication connection devices.

Aspects disclosed herein may provide improved audio coverage of the environment being served by a loudspeaker system. In an example, the loudspeaker system may provide a first beam to cover the environment above the loudspeaker, e.g., at a first level of the environment, and a different, second beam to cover the environment below the loudspeaker, e.g., at a first level of the environment. The loudspeaker may provide a plurality of different beams, which beams may be symmetrical to itself but different (e.g., asymmetrical) from an adjacent beam. Thus, a loudspeaker system or array may tune its audio coverage to the environment. This may result in a more uniform sound pressure level and improved acoustic performance throughout the environment.

FIG. 1 shows an example audio system 100 having a loudspeaker array 102, which can be a linear array, e.g., a vertical array. The loudspeaker array 102 can have its drivers being divided into a top driver group 103, e.g., a top half, and a bottom driver group 104, e.g., a bottom half. The top driver group 103 and the bottom driver group 104 may not have an equal number of drivers. The loudspeaker array 102 is not limited to two driver groups. It is within the scope of the present invention to have more than two driver groups. In an example, each driver group has more than two drivers. In some example, each driver groups may have more than five drivers. It will also be within the scope of the present disclosure to use multiple loudspeaker arrays 102 to provide acoustic coverage within a given environment e.g., a hall, a church, arena, pavilion, park, concert, public address system, and the like.

A top feed circuit 105 receives an audio signal from an audio source 106. The top feed circuit 105 can be a delay network. The top feed circuit 105 can be a transmission line with various sub-circuits, e.g., half-section circuits or series shunt half-section circuits. The top feed circuit 105 inputs a driving signal to the drivers in the top driver group 103.

A bottom feed circuit 107 receives an audio signal from the audio source 106. The bottom feed circuit 107 can be a delay network. The bottom feed circuit 107 can be a transmission line with various sub-circuits, e.g., half-section circuits or series shunt half-section circuits. The bottom feed circuit 107 inputs a driving signal to the drivers in the bottom driver group 104. The sub-circuits, e.g., the half section circuits, can individually feed input signals to drivers in the bottom driver group 104.

The sub-circuits, e.g., the half section circuits, can individually feed input signals to drivers in the driver groups 103, 104. The sub-circuits may include only passive components, e.g., resistor ("R"), inductor ("L") or capacitor ("C"). In an example, the sub-circuits include active components, e.g., switches, to select the passive components to condition the audio input signal to a driver signal for the associated driver as part of a driver group.

The audio sound source 106 can be the audio output of an entertainment system for music and/or multi-media. Each of the top driver group 103 and the bottom driver group 104 can have a plurality of drivers aligned linearly, e.g., vertically. The loudspeaker array 102 may include any number of speakers or drivers. The top feed circuit 105 can operate to beam form the resulting acoustic signal from the top driver group 103. The bottom feed circuit 107 can operate to beam form the resulting acoustic signal from the bottom driver group 104. The resulting beams from the driver groups 103, 104 can be different to provide different acoustic coverage within the environment, e.g., a hall, a church, arena, pavilion, concert, public address system, and the like.

Figure 2:
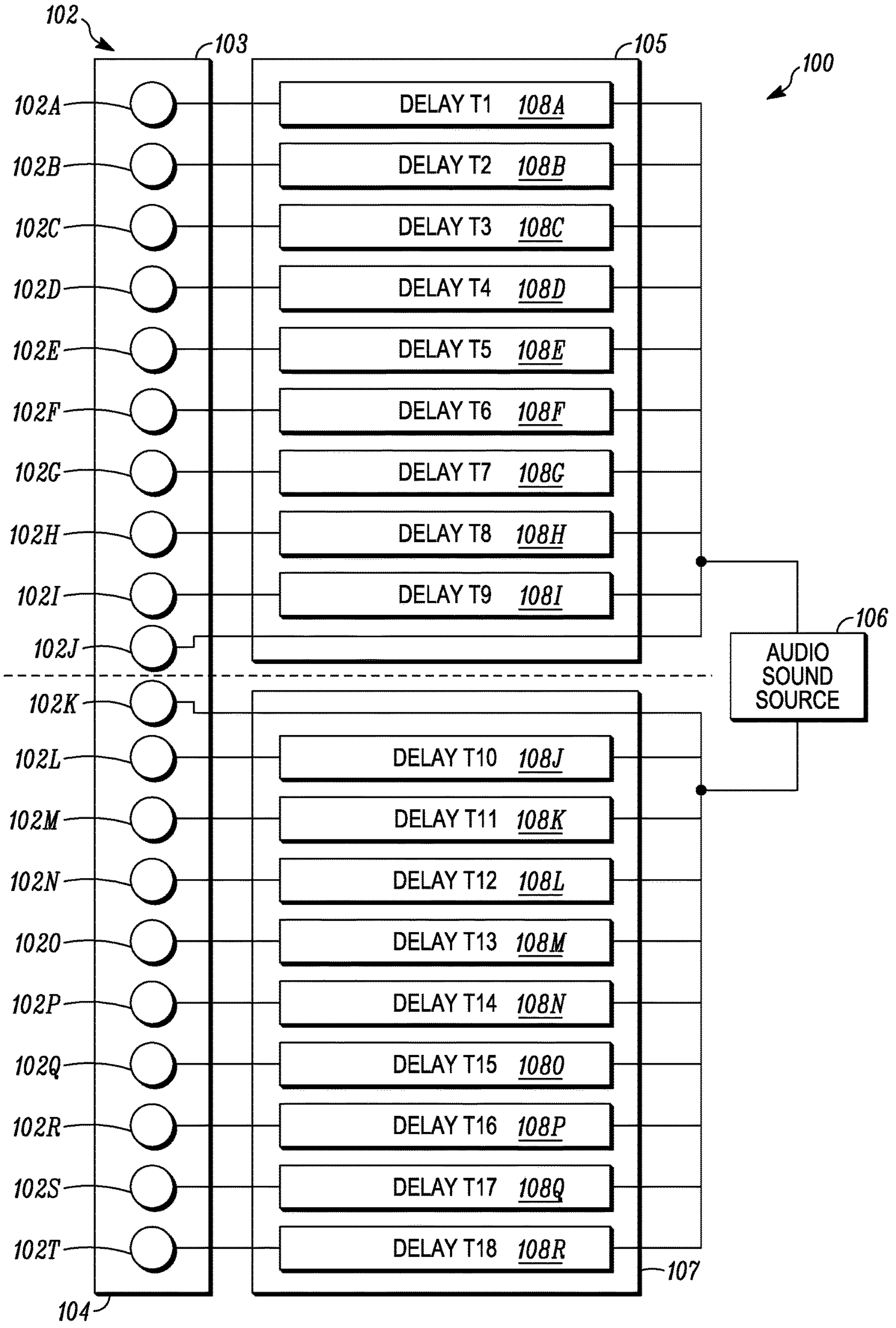
FIG. 2 shows a schematic view of an audio system according to an embodiment.

FIG. 2 shows another embodiment of the audio system 100 having the loudspeaker array 102, which is illustrated with twenty drivers 102*a*-102*t*. The drivers 102 *a*-102 *t* are aligned linearly and may be mounted in a single housing or be divided into multiple housings, which are linearly aligned. However, the loudspeaker array 102 is not limited to any particular linear orientation. For ease of description, the present disclosure may refer to a vertical array or the like, however, a horizontal array is within the scope of the present disclosure. In addition, the drivers 102*a*-102*t* are aligned linearly along at least one direction, such as vertical, horizontal or diagonal, e.g., vertical when viewed from directly in front of the loudspeaker array 102 as shown in FIGS. 1 and 2. When viewed from the side for a vertically arranged loudspeaker array 102 (both driver groups 103, 104) or from above for a horizontally arranged loudspeaker array 102, the drivers 102*a*-102*t* in the loudspeaker array 102 may be linearly arranged to form a straight line array. The drivers 102*a*-102*t* may be arranged along a curve to form a curved line array. The drivers 102*a*-102*t* may be partially linearly arranged and partially arranged along a curve. The loudspeaker array 102 may include drivers 102*a*-102*t* configured to generate a sound beam 120, 121 (FIG. 1) having any shape according to the distribution of the drivers 102*a*-102*t*, direction of projection, and the signal conditioning effects of the feed circuits 105, 107 on the source signal form the audio source 106. The loudspeaker array 102 may also be configured to generate a sound beam having a constant beam width along at least one of its linear dimensions by adjusting the delay and attenuation characteristics as described herein.

The drivers 102*a*-102*t* may be drivers of any type. For example, the drivers 102*a*-102*t* may be tweeters for generating high frequency audio, woofers for generating low frequency audio, or midrange speakers for generating midrange frequency audio. Crossover networks may be connected to the feed circuits 105, 107, which may be configured to distribute the audio signals to the appropriate drivers (for example, low frequency signals to woofers, high frequency signals to tweeters, and midrange signals to midrange drivers). The drivers 102*a*-102*t* may also be full-range drivers, each able to drive audio through the entire specified range.

Example loudspeaker arrays and feed circuits are described below in which the loudspeaker arrays include any number of full-range drivers. The size of the drivers used may be selected according to the wavelength of the upper limit of the frequencies of the sound being generated. The drivers are separated by a distance preferably less than one wavelength of the highest frequency.

The feed circuit 105 is connected to the loudspeaker array 102 as described in more detail herein. The feed circuit 105 includes a plurality of delay units, or stages, 108*a*-108*i*, configured to generate delays in the signals being coupled to the drivers 102*a*-102*j* in the first (here shown as top) group 103 of the loudspeaker array 102. In an example, the delay units 108*a*-108*i* in FIG. 2 generate delays that increase for the drivers 108*a*-108*i* from the center of the loudspeaker array 102 to an end of the first grouping 103. For example, no delay at all is applied to the signal coupled to the center driver 102*j*. A delay of nT is inserted in the signal coupled to each subsequent driver, e.g., 102*i*, 102*h*, . . . 102*a*. The largest delay is inserted into the signal coupled to the driver 102*a* on the top end of the driver group 103. The components in the delay units 108*a*-108*i* that generate the delay for each driver 102*a*-102*i* are passive components, which include components that do not require a power source for operation, such as for example, inductors, capacitors, and/or resistors. The passive components in the feed circuit 105 may be selected to generate a flat group delay with frequency such that the top driver group 103 of the loudspeaker array 102 generates sound as though the drivers 102*a*-102*j* were arranged physically or configured with digital delay to provide coverage of a constant beam transducer ("CBT"). In other examples, inductors and capacitors are arranged in a cascade of stages of arbitrary complexity with values selected to provide the desired progressive delay. The delay units 108*a*-108*i* can be implemented using passive components, but may also be implemented using delay units that include active components, such as transistors, integrated circuits, etc. The delay units 108*a*-108*i* may include other signal conditioning circuitry in addition to delay circuits.

The feed circuit 107 is connected to the loudspeaker array 102 as described in more detail herein. The feed circuit 107 includes a plurality of delay units, or stages, 108*j*-108*r*, configured to generate delays in the signals being coupled to the drivers 102*k*-102*t* in the second (here shown as bottom) driver group 104 of the loudspeaker array 102. In an example, the delay units 108*j*-108*r* in FIG. 2 generate delays that increase for the drivers 108*k*-108*t* from the center of the loudspeaker array 102 to an end of the second grouping 104. For example, no delay at all is applied to the signal coupled to the center driver 102*k*. A delay of nT is inserted in the signal coupled to each subsequent driver, e.g., 102*l*, 102*m*, . . . 102*t*. The largest delay is inserted into the signal coupled to the driver 102*t* on the bottom end of the bottom driver group 104. The components in the delay units 108*j*-108*r* that generate the delay for each driver 102*l*-102*t* are passive components, which include components that do not require a power source for operation, such as for example, inductors, capacitors, and/or resistors. The passive components in the feed circuit 107 may be selected to generate a flat group delay with frequency such that the second driver group 103 of the loudspeaker array 102 generates sound as though the drivers 102*k*-102*t* were arranged physically or configured with digital delay to provide coverage of a constant beam transducer ("CBT"). In other examples, inductors and capacitors are arranged in a cascaded ladder circuit with values selected to provide the desired progressive delay. The delay units 108*j*-108*r* can be implemented using passive components, but may also be implemented using delay units that include active components, such as switches, transistors, integrated circuits, etc.

It is noted that the description below describes examples of feed circuits in which the delay units (such as delay units 108*a*-108*r*) are applied symmetrically about the center drivers in each driver group 103, 104. That is, the delays generated by each delay unit are equal and the feed circuit is configured to increment the sum of delays at each driver positioned away from the center drivers of each driver group 103, 104. In other examples, the feed circuits 105, 107 need not be symmetrical. Each delay unit in the feed circuit 105 or 107 may have a unique delay value and different attenuation characteristics that a designer may configure to generate a desired constant beam width pattern from each of the driver groups 103, 104.

Figure 3:
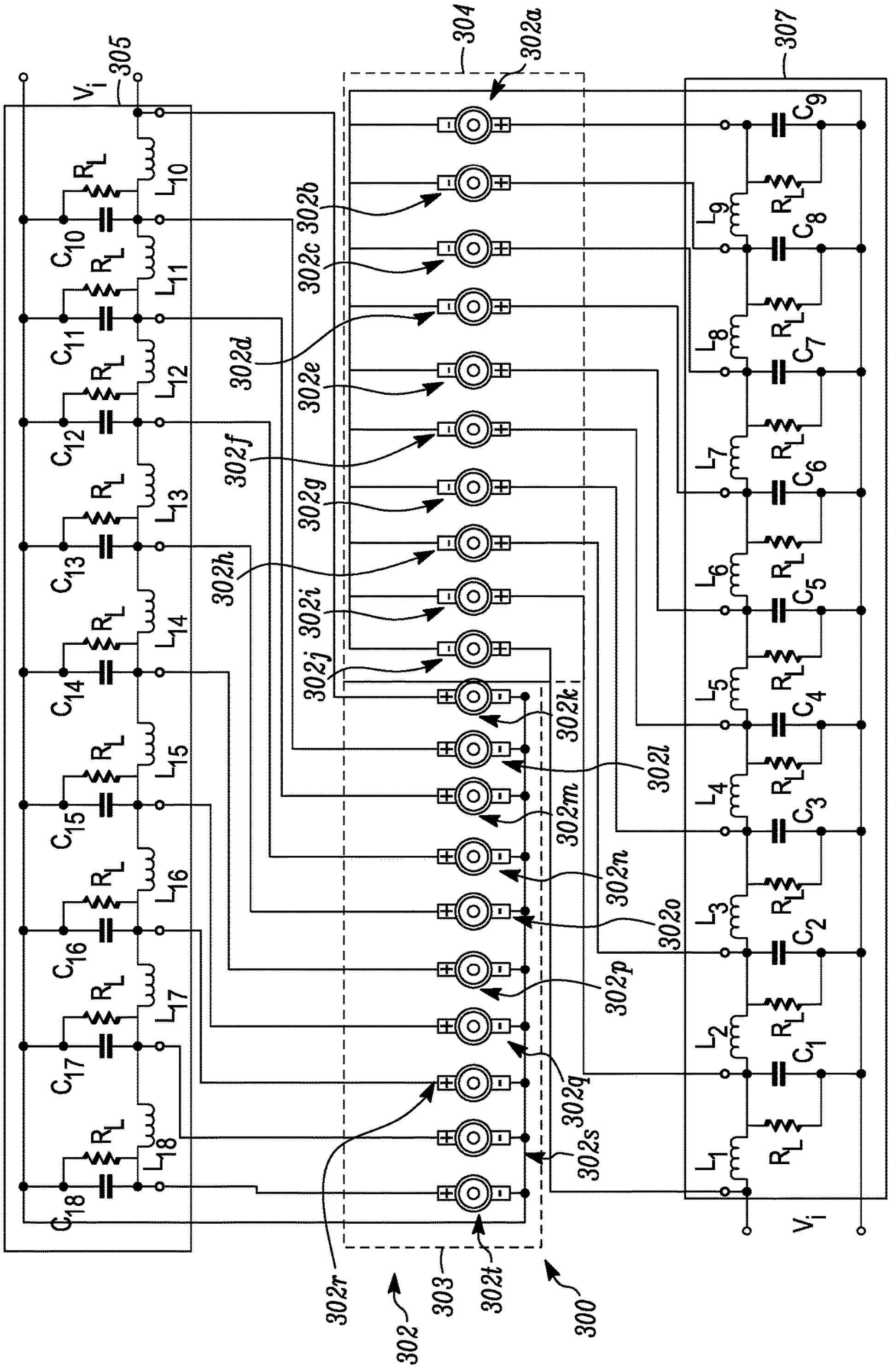
FIG. 3 shows a schematic view of an audio system with the drivers and delay circuits, according to an embodiment.

FIG. 3 is a schematic diagram of an example of the loudspeaker array and feed circuit, e.g., as shown in FIG. 1 or FIG. 2. Similar elements are designated with the same least significant digits and the hundreds place value being changed from 100 to 300. The example array with system 300 in FIG. 3 includes a 20-element loudspeaker array 302 and transmission lines 305, 307, which are examples of the feed circuits 105, 107 shown in FIG. 1. In an example, the transmission lines 305, 307 are cascaded LC ladder networks. The transmission lines 305, 307 are tapped transmission lines. Taps are provided along the transmission lines 305, 307 to provide feed signals to respective drivers of the loudspeaker array 302. The loudspeaker array 302 includes twenty drivers 302*a*-302*t* arranged linearly, which are separated into a first driver group 303 (right side as shown in FIG. 3) and a second driver group 304 (left side as shown in FIG. 3). The configuration in FIG. 3 is horizontal, however, a vertical configuration may be used as well. The configuration in FIG. 3 is planar, however, an arced configuration may be used as well. An arced configuration may appear linear in a front view and curved when viewed from the side.

Assuming a horizontal configuration, the first driver 302*a* is located on one end of the array, e.g., at one end of the first driver group 304. The remaining drivers 302*b*-302*t* are then aligned in order such that the driver 302*t* is in the other driver group 304 and is on the opposite end of the driver 302*a*. The drivers 302*j* and 302*k* are positioned adjacent each other and are in different driver groups 303 and 304, respectively, and in the center of the loudspeaker array 302.

Assuming a vertical configuration, the driver 302*a* is positioned at the bottom of the bottom driver group 304 of the loudspeaker array 302. The driver 302*j* is positioned at the top of the bottom driver group 304 of the loudspeaker array 302. The driver 302*k* is positioned at the bottom of the top driver group 305 of the loudspeaker array 302. The driver 302*t* is positioned at the top of the top driver group 305 of the loudspeaker array 302. The center drivers 302*j*, 302*k* are positioned in the middle of the vertical loudspeaker array 202 at the top of the bottom driver group 304 and the bottom of the top driver group 305. In the description that follows, a vertical configuration is assumed. However, examples of the described implementations are not limited to vertical configurations.

A first, tapped transmission line 305 is connected to an input signal Vi. The transmission line 305 includes delay units, or stages, formed with inductors L10-L18 and capacitors C10-C18 connected to form a cascaded ladder of LC branches with taps used to connect to the drivers 302*k*-302*t* in top driver group 303 of the loudspeaker array 302. Each stage includes a stage input and a stage output. The stages are configured such that the inductors L10-L18 are connected in series with the input signal Vi and the capacitors C10-C18 are connected in parallel with pairs of drivers between the inductors. The stage output for each stage in the transmission line 305 in FIG. 3 is the stage input for the next stage in the transmission line 305. The stage output for the first stage is the stage input for the second stage. The stage output for the second stage is the stage input for the third stage. As shown in FIG. 3, each capacitor Ci of the LC branches forming the stages connects to the node between each inductor. The taps to the transmission line 305 are at each stage output, which is the node connecting the capacitor between the inductors. The values of the inductors L10-L19 and capacitors C10-C18 are selected to insert the appropriate delay to the signal being coupled to the corresponding drivers. The negative terminals of all of the drivers 302*k*-302*t* are connected to a common terminal with one end of a stage.

A second, tapped transmission line 307 is connected to an input signal Vi. The transmission line 307 includes delay units, or stages, formed with inductors L1-L9 and capacitors C1-C9 connected to form cascaded stages of LC branches with taps used to connect to the drivers 302*a*-302*j* in the bottom driver group 304 of the loudspeaker array 302. Each stage includes a stage input and a stage output. The stage input of a successive stage may be the stage output of a preceding stage. The stages are configured such that the inductors L1-L9 are connected in series with the input signal Vi and the capacitors C1-C9 are connected in parallel with pairs of drivers between the inductors. The stage output for each stage in the transmission line 307 in FIG. 3 is the stage input for the next stage in the transmission line 307. The stage output for the first stage is the stage input for the second stage. The stage output for the second stage is the stage input for the third stage. As shown in FIG. 3, each capacitor Ci of the LC branches forming the stages connects to the node between each inductor. The taps to the transmission line 307 are at each stage output, which is the node connecting the capacitor between the inductors. The values of the inductors L1-L9 and capacitors C1-C9 are selected to insert the appropriate delay to the signal being coupled to the corresponding drivers. The negative terminal of all of the drivers 302*a*-302*j* are connected to a common terminal with one end of a stage.

The configuration of the stages in FIG. 3 can be a low pass filter. While the topology is the same as a low pass filter, the values of the components are different. The component values are mistuned. That is, the component values are sized to create flat group delay with frequency, which is not done with low pass filters. The component values are also sized to create relatively flat attenuation over a broad frequency range.

The taps to the transmission lines 305, 307 are connected to the drivers 302*a*-302*t* such that the shortest delays are provided to the signals coupled to the drivers in the center of the driver group and the delays increasing to the signals coupled to the drivers extending up and down from center drivers 302*p* and 302*o*, 302*e* and 302*f*. In an example, each driver group 303, 304 and transmission lines 305, 307 can have a configuration that is described in U.S. Pat. No. 8,971,547, which is hereby incorporated by reference. The drivers in the first driver group 302*a*-302*j* can be driven in driver pairs physically positioned symmetrically about the center of the first driver group of the loudspeaker array 302. The subsequent driver pairs are arranged similarly from the center to the top and bottom. The driver pairs are connected to the transmission line 305 such that the signal is coupled to one terminal (for example, the '+' terminal) of one driver in the pair. The other terminal (for example, the '−' terminal) is connected to a terminal (for example, the '+' terminal) of the other driver in the driver pair. The opposite terminal (for example, the '−' terminal) of the other driver in the driver pair is connected to a common connection that connects one terminal of the first driver group 304 in the array 302. That is, the common connection connects one terminal of the drivers in each group. An opposite terminal of the driver pair is connected to the transmission line 305 to receive the delayed signal or other processed signal.

As shown in FIG. 3, the center drivers **302*j*, 302*k* are connected to the audio signal input Vi such that the audio signal coupled to the center drivers 302*j*, 302*k* is not conditioned by a stage, e.g., a delayed signal. The LC branch formed with inductor L1 and capacitor C1 provides the first delay, which is inserted to the signal coupled to the driver 202*i*. The LC stage formed with inductor L2 and capacitor C2 provides the second delay, which is added to the first delay and inserted to the signal coupled to the subsequent driver 302*h*. Each succeeding stage formed by inductors L3-L9 and capacitor C3-C9** provides a progressively greater delay to each succeeding driver such that the delay is increasing for the drivers closest to the bottom of each group. Effectively, each driver of transducers is tapped off the ladder at further increments in group delay so the outside transducers receive delay from all sections of the ladder thereby receiving the greatest delay. The group delay yields an apparent curving of the array in the vertical dimension for the sound output by the driver group. Each of the groups can have different delay and other processing of the input signal. Thus, one group yields a different apparent curving of the acoustic output relative to another group in the loudspeaker.

Figure 4A:
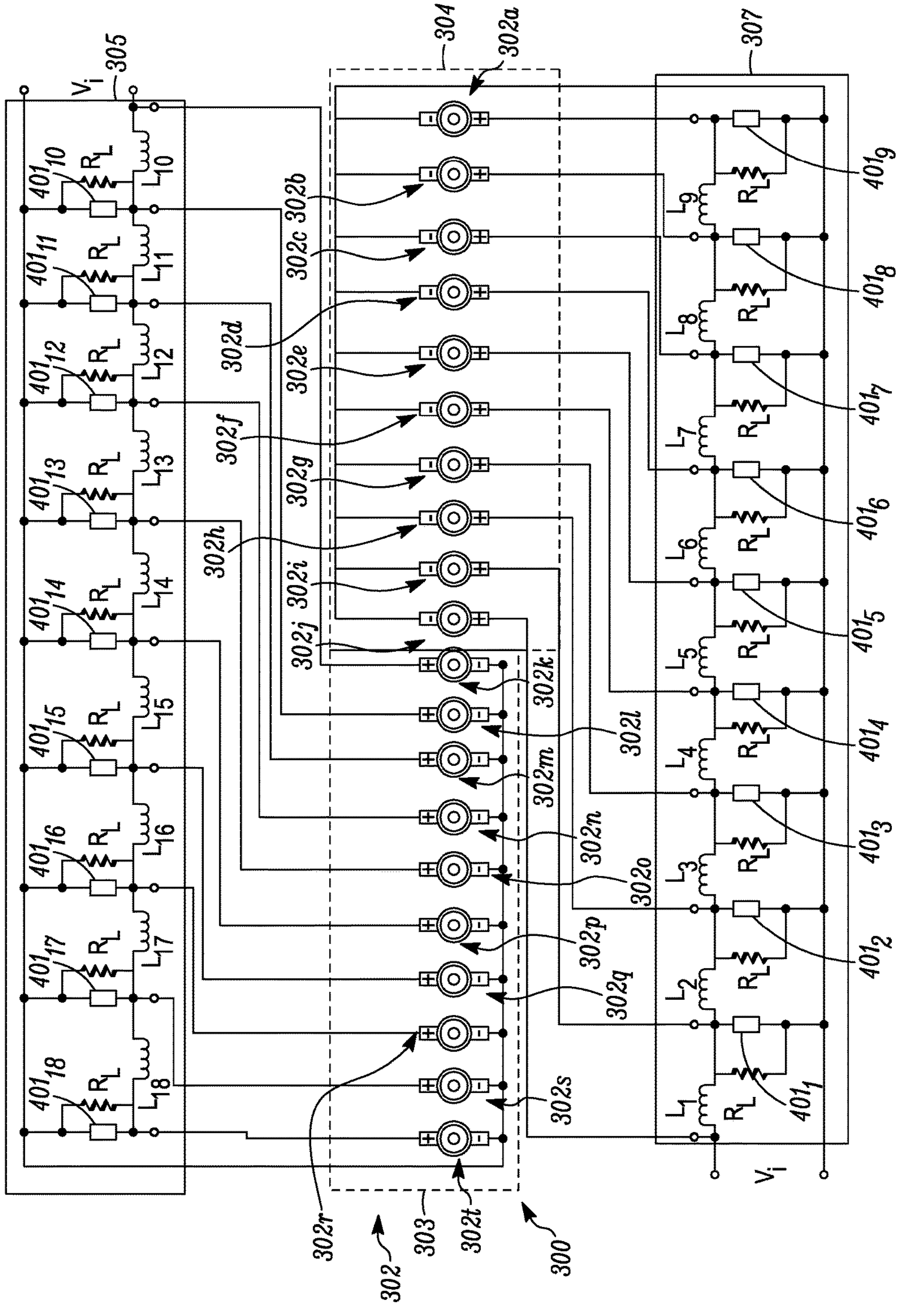
FIG. 4A shows a schematic view of an audio system with the drivers and delay circuits, according to an embodiment.

FIG. 4A is a schematic diagram of an example of the loudspeaker array and transmission lines 400 that is the similar to the structure 300 as shown in FIG. 3. Similar elements are designated with the same reference numbers. The capacitors C1-C18 as shown in FIG. 3 are replaced by sub-circuits $\mathbf{401}_1$-$\mathbf{401}_{18}$. The sub-circuits $\mathbf{401}_1$-$\mathbf{401}_{18}$ include various elements that are controllable, e.g., using a controller circuit (not shown), to control each output supplied to each driver of the first driver group 303 and the second driver group 304. In an example, the sub-circuits $\mathbf{401}_1$-$\mathbf{401}_{18}$ include at least one capacitor, e.g., $C_1$-$C_N$. The capacitors may be the same as one of the capacitors C1-C18 in FIG. 3, but in a single sub-circuit.

Figure 4B:
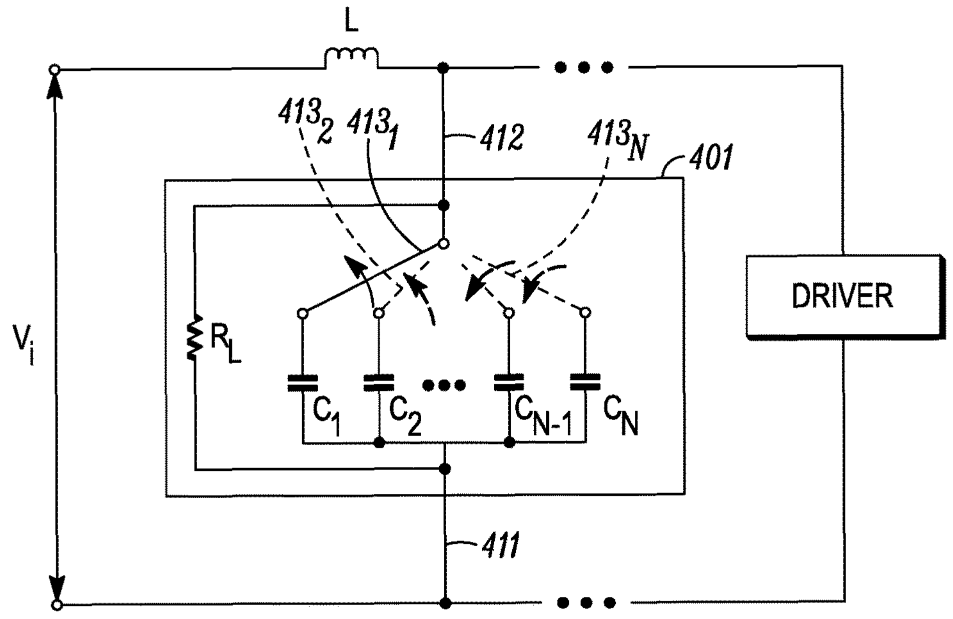
FIG. 4B shows a delay stage, according to an embodiment.

Referring to FIG. 4B, a sub-circuit 401 is shown. The sub-circuit 401 includes a first terminal 411 that connects to the common terminal of the transmission line 305 or the common terminal of the transmission line 307. The circuit includes a second terminal 412 that connects to the input terminal from the transmission line 305 or the common terminal of the transmission line 307 to the associated driver 302. A plurality of circuit elements, e.g., capacitors $C_1$, $C_2$, $C_{N-1}$ and $C_N$, are provided that can control the amount of delay to the drivers in the associated driver group. Other circuit elements can be included, e.g., in place of a capacitor or with the capacitor. Such other circuit elements can include an active element, e.g., a transistor. The circuit elements can be selectively part of the active circuit in the delay circuit (e.g., sub-circuit 401) using switches $\mathbf{413}_1$-$\mathbf{413}_N$. The switches $\mathbf{413}_1$-$\mathbf{413}_N$ selectively connect the circuit elements between the terminals 411, 412. As each of the switches $\mathbf{413}_1$-$\mathbf{413}_N$ can be individually activated (e.g., switched by a controller), thus there are $N^2$ combinations of settings for the delay circuit (e.g., sub-circuit 401). For example, if there are two circuit elements, e.g., $C_1$ and $C_2$, then there are four combinations, (a) both switches $\mathbf{413}_1$ and $\mathbf{413}_2$ are open, (b) switch $\mathbf{413}_1$ is closed and switch $\mathbf{413}_2$ is open, (c) switch $\mathbf{413}_1$ is open and switch $\mathbf{413}_2$ is closed, and (d) both switches $\mathbf{413}_1$ and $\mathbf{413}_2$ are closed. The first combination does not have either of the circuit elements $C_1$, $C_2$ as part of the delay circuit. The second combination has the circuit element $C_1$ in the delay circuit and does not have the circuit element $C_2$ as part of the delay circuit 401. The third combination has the circuit element $C_2$ in the delay circuit and does not have the circuit element $C_1$ as part of the delay circuit. The fourth combination has both circuit elements $C_1$, $C_2$ as part of the delay circuit. The present embodiment allows the delay networks to be programmed to control the delay to any individual driver 302 on an individual basis. Thus, the top driver group can provide a different beam than the bottom driver group.

Figure 4C:
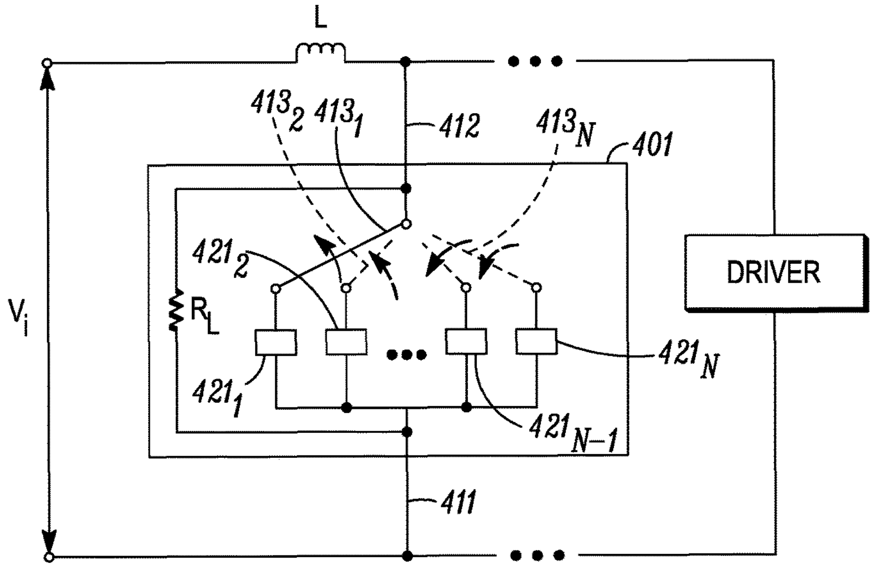
FIG. 4C shows a delay stage, according to an embodiment.

FIG. 4C is a view similar to FIG. 4B but showing circuitry $\mathbf{421}_1$-$\mathbf{421}_N$ replaces the capacitors $C_1$-$C_N$. Circuitry $\mathbf{421}_1$-$\mathbf{421}_N$ can include any circuit element that is used in a transmission line to control the electrical signal transmitted thereby. In an example, the circuitry $\mathbf{421}_1$-$\mathbf{421}_N$ includes an inductor. In an example, the circuitry $\mathbf{421}_1$-$\mathbf{421}_N$ includes a resistor, inductor, capacitor (RLC) circuit. In some examples, active circuit elements are part of at least one circuitry $\mathbf{421}_1$-$\mathbf{421}_N$. In some examples, each circuitry $\mathbf{421}_1$-$\mathbf{421}_N$ is the same and adding in additional circuity adds to the signal processing. In some examples, at least one of the circuitries $\mathbf{421}_1$-$\mathbf{421}_N$ is different than other circuitries. Each circuitry $\mathbf{421}_1$-$\mathbf{421}_N$ is selectively connected to be electrically conductive within the transmission line, e.g., by the connection of switches 413. Thus, each stage with one of the circuitry $\mathbf{421}_1$-$\mathbf{421}_N$ can have a different electrical effect on the signal, e.g., a delay, sent to its associated driver relative to another of the circuitry $\mathbf{421}_1$-$\mathbf{421}_N$.

Figure 4D:
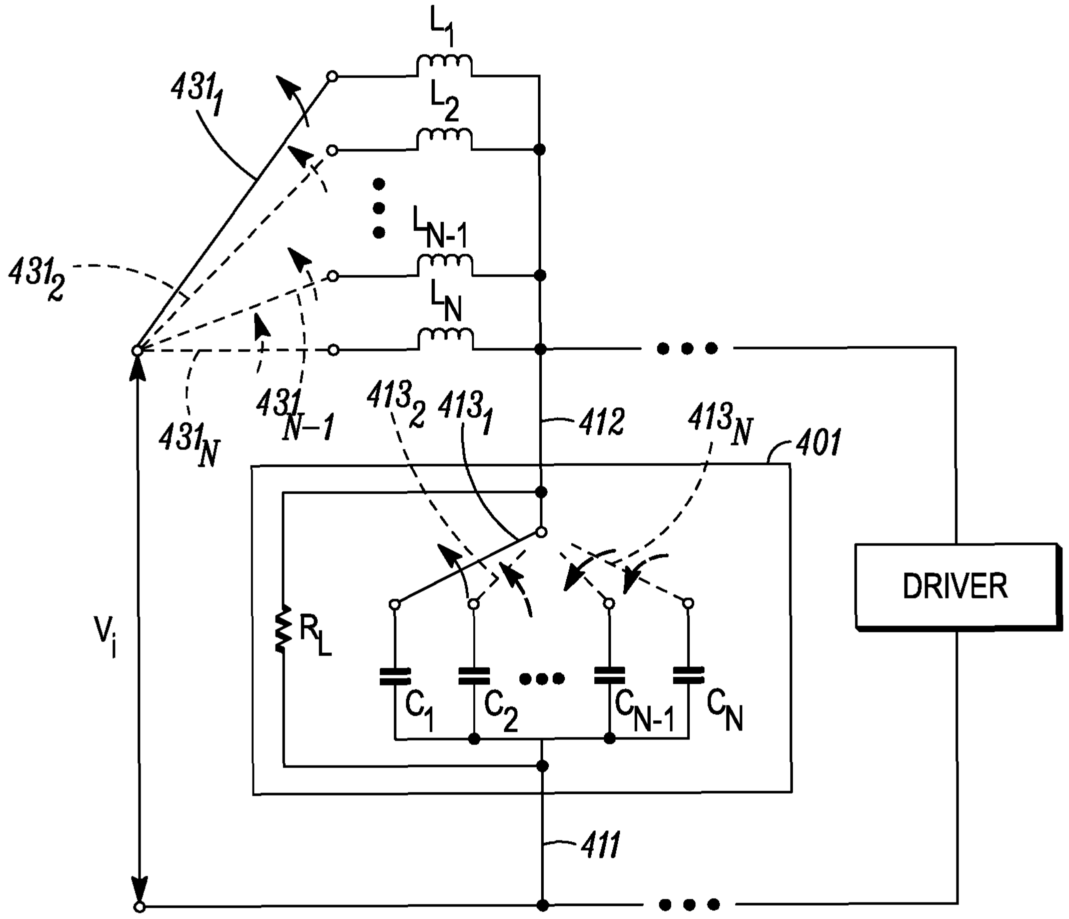
FIG. 4D shows a delay stage, according to an embodiment.

FIG. 4D is a view similar to FIG. 4B but showing a plurality of switchable inductors $L_1$, $L_2$, . . . $L_{N-1}$, $L_N$ replacing the inductor L of FIG. 4B. While shown as inductors $L_1$-$L_N$ it is also within the scope of the present disclosure to use circuitry $\mathbf{421}_1$-$\mathbf{421}_N$ in place of the inductors $L_1$-$L_N$ and can include any circuit element that is used in a transmission line to control the electrical signal transmitted thereby. Each inductors $L_1$-$L_N$ is selectively connected to be electrically conductive within the transmission line, e.g., by the connection of switches $\mathbf{431}_1$-$\mathbf{431}_N$. Thus, each stage with one of the switchable inductors $L_1$-$L_N$ can have a different electrical effect on the signal sent to its associated driver relative to another of stages. It will be appreciated that at least one of the inductors $L_1$-$L_N$ is inline or switched to conducting as this connection feeds the Vi signal to the next stage as well as the associated driver.

The transmission lines 305, 307 include an audio input signal generator coupled to the input of the transmission line to provide the input signal Vi. In addition to the group delay being inserted at the signal coupled to drivers, the signal is progressively or selectively attenuated.

Figure 5A:
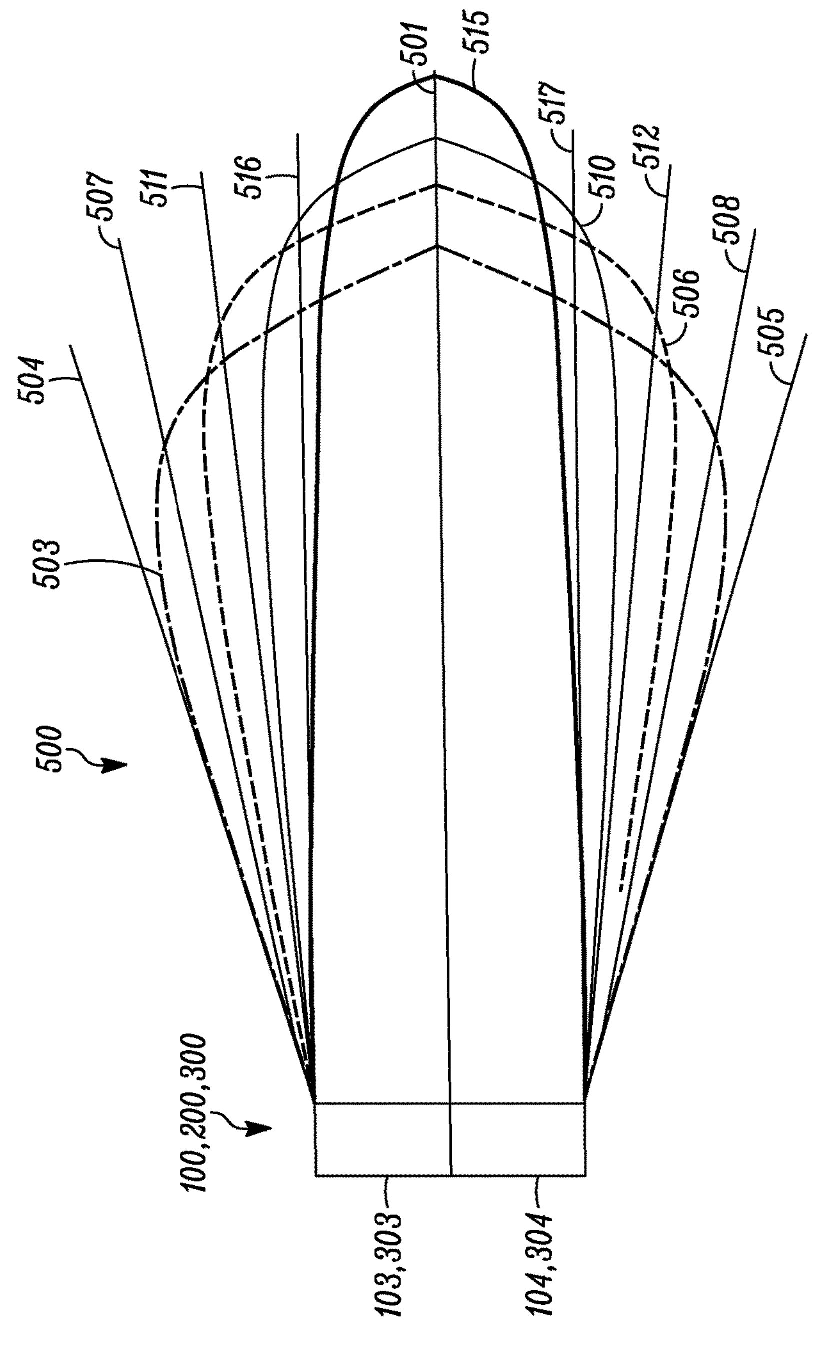
FIG. 5A shows a schematic view of an audio system with multiple beam that can be formed by the system, according to an embodiment.

FIG. 5A is a graph 500 illustrating the exemplary beam patterns that can be generated by a system or loudspeaker 100, 200 or 300. A center axis is shown at 501. A wide beam pattern 503 is shown within a top wide beam boundary 504 and a bottom wide beam boundary 505. A short throw beam pattern 506 is shown within a medium top boundary 507 and a medium bottom boundary 508. A long throw beam pattern 510 is shown within a long throw top boundary 511 and a long throw bottom boundary 512. A narrow beam pattern 515 is shown within a narrow top boundary 516 and a narrow bottom boundary 517. These beam patterns 503, 506, 510, and 515 are symmetrical about the center access. To achieve this symmetry, the top driver group 103, 303 may have a delay that is different from the bottom driver group 103, 304. The top part, e.g., half, of any beam pattern 503, 506, 510, and 515 is above the center line or plane, which can include the center axis 501. The bottom part, e.g., half, of any beam pattern 503, 506, 510, and 515 is below the center line. As each of the driver groups 103, 303 and 104, 304 are controlled by a separate feed circuit or transmission line, which may be individually programmable.

Figure 5B:
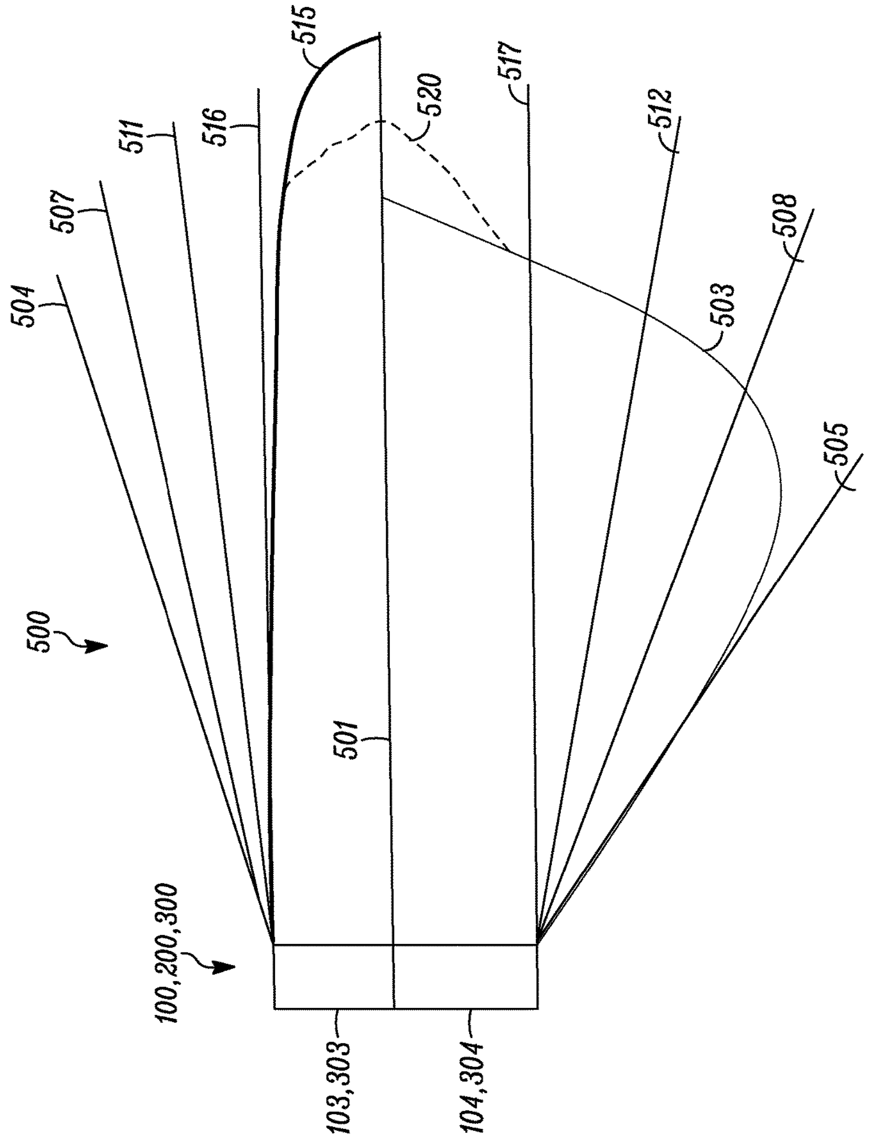
FIG. 5B shows a schematic view of an audio system with single beam from the system, according to an embodiment.

FIG. 5B is a graph 500B illustrating a top beam pattern 515 that is different than the bottom beam pattern 503. In this example, the top beam pattern 515 is produced by the top driver group 103 or 303 and is a narrow beam pattern. The bottom beam pattern 503 is produced by the bottom driver group 104 or 304 and is a downfill (wide) beam pattern. These beam patterns are shown in their ideal state about the center axis 501. However, there will be cross over or blending of the beam patterns 515, 503 adjacent the center axis 501. The real beam 520 will be a combination of the two beam patterns 515, 503 adjacent the center axis 501.

The loudspeaker 100, 200, 300 are described with reference to vertically-oriented arrays. FIGS. 5A and 5B show performance of a vertically oriented loudspeaker. The loudspeaker arrays may also be oriented horizontally. The term 'beamwidth' refers to a width in the direction of the array configuration.

The loudspeaker array may include a housing that encloses the plurality of driver groups. The housing may be a single housing that forms a linear array of drivers (e.g., transducers). The loudspeaker may provide a unitary solution to providing improved acoustic coverage by having different beam patterns from different driver groups. The different beam patters may be produced by controlling each driver group using the networks and the delay stages or delay elements. In an example, coverage may be providing a uniform sound pressure level in the space that may not be of uniform shape.

Figure 6:
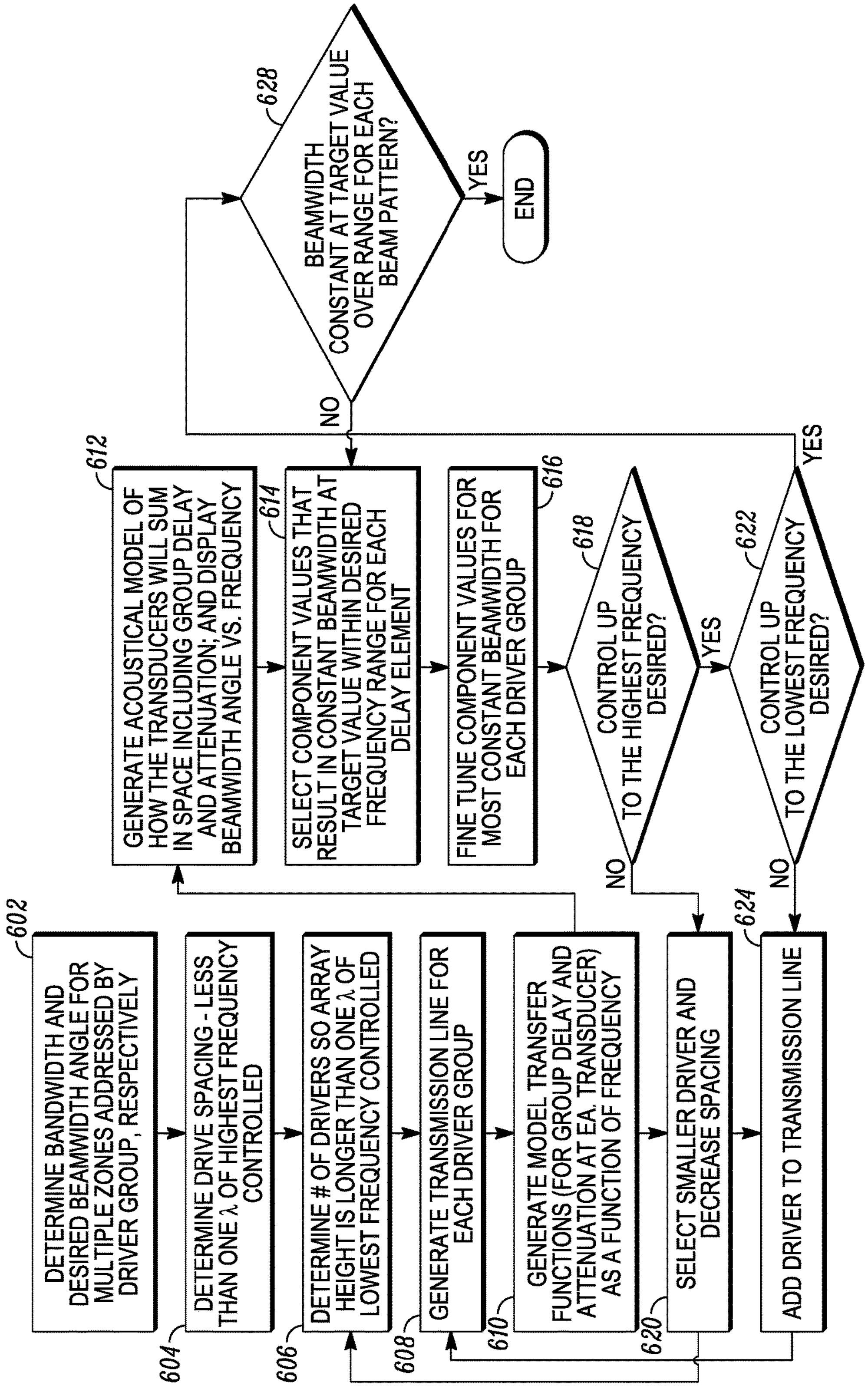
FIG. 6 is a flowchart depicting operation of an example of a method for providing a beam coverage pattern using a linear loudspeaker array.

FIG. 6 is a flowchart depicting operation of an example of a method for providing an asymmetrical coverage pattern using a linear loudspeaker array, e.g., 100, 200 or 300. The method illustrated in FIG. 6 may be implemented using a computer program having a user interface that permits user interaction for setting component values (e.g., controlling the switches in the sub-circuit 401), loudspeaker positions, configuring views for data analysis, and setting any other parameter. The computer program may be developed as an application using a suitable programming language, or may be implemented as a macro or a sequence of instructions in an application such as a spreadsheet, a database, or suitable alternatives. The example method illustrated in FIG. 6 allows a user to determine component values for use in a selected network to create the asymmetrical coverage pattern with a linearly arranged loudspeaker array. The method also allows the user to optimize performance of the network by ensuring that a constant beam width is achieved at a desired level over the desired frequency range for both the top, first driver group 103, 303 and the bottom, second driver group 104, 304.

At step 602, the desired beamwidth and the desired bandwidth are determined for both the first driver group and the second driver group. The beamwidth and bandwidth specifications may be entered into memory, or may be requested from the user via a user interface query. The user interface query may be a menu-driven interface, an electronic form, or any suitable alternative form of data entry.

At step 604, the driver spacing is determined in the driver groups. The spacing is the distance between the drivers. The driver spacing may be provided in memory or requested from the user via a user interface. In general, the driver spacing should be less than one wavelength (λ) of the highest frequency being controlled.

At step 606, the number of drivers to be used in the groups in the linear array is determined, driver spacing is determined. The number of drivers may be provided in memory or requested from the user via a user interface. In general, the number of drivers in each group should be selected so that the height of the linear array is longer than one wavelength (λ) of the lowest frequency being controlled.

At step 608, transmission lines are generated for the driver groups, respectively. The transmission line may be defined by the topology of the stages, the components and component values. The configuration of each stage may be predefined in memory and offered to the user as alternatives from which to choose.

At step 610, a model transfer function is generated for the group delay or the attenuation at each transducer by a stage of the transmission line. The group delay or attenuation is generated as a function of frequency. The transfer function may be generated as a graph, but may be any user readable output. This is also done for each group.

At step 612, an acoustical model illustrating how the transducers will sum in space is generated. The model includes separate drive groups for at least a top part of the space and the bottom part of the space. The model includes the group delay or attenuation, and may be displayed as beamwidth vs. the frequency for each driver group.

At step 614, the component values of the components in the stages of the transmission line may be adjusted to obtain a constant beamwidth over the desired frequency range. The component values may be selected from a broad range of values for each component. The values are selected to provide a near constant beamwidth at the desired frequency range. An initial set of values are selected for optimization by further fine tuning of the values. The adjusting or the optimizing may be done using the switches to control each delay circuit (e.g., 401) for each driver, e.g., transducer.

At step 616, the component values are fine-tuned for the best beamwidth for the particular part of the space that each driver group is addressing. Step 616 can perform a local search. A computational optimizer may be used in step 616 to fine tune the values until values are found that result in the most constant beamwidth at the target value over the required range. Once found, the switches may select the delay for each driver in a driver group to achieve the desired beam pattern, e.g., beamwidth. Optimizers have an initial condition (or a seed), and will find the local minima, maxima, or fixed values. The computational optimizer may use the component values found in step 614 as a seed.

At decision block 618, the acoustical model is checked to determine if it controls up to the highest frequency. If it does not ("No" branch), a smaller driver and driver spacing are selected at step 620 and the method goes back to step 606. If control up to the highest frequency is attained ("Yes" branch), the acoustical model is checked to determine if it controls down to the lowest frequency at decision block 622. If it is not ("No" branch), additional drivers are added to the transmission line at step 624. The method then continues to step 608 to generate a new transmission line. If control to the lowest frequency is attained at decision block 622 ("Yes" branch), the beamwidth is checked over the entire range at the target value. If the beamwidth is not constant ("No"

branch), new seed component values are selected at step 614. If the beamwidth is constant ("Yes" branch), the design is complete.

A loudspeaker array and methods for generating sound in at least two patterns are described. The loudspeaker array includes a plurality of loudspeakers, each with a plurality of driver groups. A feed circuit, e.g., the transmission line, is included for each driver group. The transmission line has a plurality of stages. Each stage has a stage input and a stage output. The stage output of each stage is coupled to the stage input of a next stage. Each stage output is also connected to at least one of the plurality of drivers or loudspeakers. The stage input of the first stage is coupled to an audio signal input. Each stage is configured to add an electrical delay of the audio signal for each subsequent stage or other signal processing at each stage for a group of drivers. The electrical delay is adjusted such that the plurality of loudspeakers generates sound in a desired radiation pattern.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

The invention claimed is:

1. A loudspeaker, comprising:

A first group of drivers to output a first beam pattern;

A first tapped transmission line that controls an input to the first group of drivers;

A second group of drivers that is different from the first group of drivers, wherein the second group of drivers is configured to output a second beam pattern; and A second tapped transmission line that controls an input to the second group of drivers, the second tapped transmission line being different from the first tapped transmission line, Wherein the first tapped transmission line includes a plurality of processing stages corresponding to a number of the first group of drivers;

Wherein the second tapped transmission line includes a plurality of delay stages corresponding to a number of the second group of drivers, and Wherein the first beam pattern is a narrow beam and the second beam pattern is a wide beam pattern that is wider than the narrow beam of the first beam pattern.

2. The loudspeaker of claim 1, wherein the first tapped transmission line includes a plurality of delay stages corresponding to a number of the first group of drivers; and wherein the second tapped transmission line includes a plurality of delay stages corresponding to a number of the second group of drivers.

3. The loudspeaker of claim 2, wherein the plurality of delay stages is programmable to control a delay at the plurality of delay stages.

4. A loudspeaker comprising:

a first group of drivers to output a first beam pattern;

a first tapped transmission line that controls an input to the first group of drivers;

a second group of drivers that is different from the first group of drivers, wherein the second group of drivers is configured to output a second beam pattern; and a second tapped transmission line that controls an input to the second group of drivers, the second tapped transmission line being different from the first tapped transmission line, wherein the first tapped transmission line includes a plurality of processing stages corresponding to a number of the first group of drivers;

wherein the second tapped transmission line includes a plurality of delay stages corresponding to a number of the second group of drivers;

wherein the plurality of processing stages is configured to control a processing of an audio input signal delay; and wherein the first beam pattern is a narrow beam and the second beam pattern is a wide beam pattern that is wider than the narrow beam of the first beam pattern.

5. The loudspeaker of claim 4, wherein at least one processing stage of the plurality of processing stages includes a switch that selectively connects at least one of the plurality of circuit elements to provide a select signal processing for a respective one of the drivers of the first group of drivers.

6. The loudspeaker of claim 1, wherein the first beam pattern and the second beam pattern are asymmetrical to each other and with asymmetry controlled by the first group of drivers and the second group of drivers, respectively.

7. A loudspeaker comprising:

a first group of drivers to output a first beam pattern;

a first tapped transmission line that controls an input to the first group of drivers;

a second group of drivers that is different from the first group of drivers, wherein the second group of drivers is configured to output a second beam pattern; and a second tapped transmission line that controls an input to the second group of drivers, the second tapped transmission line being different from the first tapped transmission line, wherein the first tapped transmission line includes a plurality of delay stages corresponding to a number of the first group of drivers;

wherein the second tapped transmission line includes a plurality of delay stages corresponding to a number of the second group of drivers, wherein the plurality of delay stages is set to control a delay at the plurality of delay stages, wherein at least one of the plurality of delay stages includes a plurality of circuit elements that is selectively conductive to set the delay of the at least one of the plurality of delay stages, and wherein the first beam pattern is a narrow beam and the second beam pattern is a wide beam pattern that is wider than the narrow beam of the first beam pattern.

8. The loudspeaker of claim 7, wherein the at least one of the delay stages includes a switch that selectively connects at least one of the plurality of circuit elements to provide a select delay.

9. The loudspeaker of claim 8, wherein the plurality of circuit elements includes only passive elements.

10. The loudspeaker of claim 7, wherein the first beam pattern and the second beam pattern are asymmetrical to each other and with asymmetry separately controlled by the first group of drivers and the second group of drivers, respectively.

11. A loudspeaker array comprising:

a first group of drivers to output a first beam pattern;

a second group of drivers that is different from the first group of drivers, wherein the second group of drivers is configured to output a second beam pattern;

a first tapped transmission line having a plurality of first stages connected to the first group of drivers, each first stage of the plurality of first stages having a first stage input and a first stage output, the first stage output of each first stage of the plurality of first stages, except for a last first stage output, being coupled to the first stage input of a next first stage and to at least one driver of the first group of drivers, the first stage input of a first stage being coupled to an audio signal input, where each first stage includes an LC branch where at least one first inductor is in series with the first stage input and the first stage output, and at least one first capacitor is connected to the first stage output in parallel with the at least one of a plurality of drivers of the first group of drivers;

a second tapped transmission line having a plurality of second stages connected to the second group of drivers, each second stage of the plurality of second stages having a second stage input and a second stage output, the second stage output of each second stage of the plurality of second stages, except for a last second stage output, being coupled to the second stage input of a next second stage and to at least one of the second group of drivers, the second stage input of a first second stage being coupled to the audio signal input, where each second stage includes an LC branch where at least one second inductor is in series with the second stage input and the second stage output, and at least one second capacitor is connected to the second stage output in parallel with the at least one of the plurality of drivers of the second group; and each first stage of the plurality of first stages and the second stage of the plurality of second stages being configured to add an electrical delay to each subsequent stage, respectively, wherein the electrical delay is adjusted such that the first group of drivers and the second group of drivers generate sound in a desired asymmetrical radiation pattern that is a sum of the first beam pattern and the second beam pattern with the first beam pattern and the second beam pattern being asymmetrical relative to each other, wherein the first beam pattern is configured to provide sound to a first volume of an environment adjacent the loudspeaker array;

wherein the second beam pattern is configured to provide sound to a second volume of an environment adjacent the loudspeaker array; and wherein the first beam pattern is a narrow beam and the second beam pattern is a wide beam pattern that is wider than the narrow beam of the first beam pattern.

12. The loudspeaker array of claim 11, wherein the first group of drivers is arranged in a first linear array having a first driver positioned at an end of the first linear array that receives a first input signal from the first tapped transmission line that is not affected by a stage of the first tapped transmission line.

13. The loudspeaker array of claim 12, wherein the second group of drivers is arranged in a second linear array having a second driver positioned at an end of the second linear array that receives the input signal from the second tapped transmission line that is not affected by a second stage of the second transmission line.

14. The loudspeaker array of claim 13, wherein the first driver and the second driver are remote from each other.

15. The loudspeaker array of claim 13, wherein the first driver and the second driver are adjacent at a middle of the loudspeaker array.

16. The loudspeaker array of claim 12, wherein a component value for each first stage and second stage is selected to adjust an electrical delay of the first input signal to the first group of drivers and the second input signal to the second group of drivers.

17. The loudspeaker array of claim 11, wherein the asymmetrical desired radiation pattern is controlled by the first beam pattern in a first volume of a loudspeaker environment and by the second beam pattern in a second volume of the loudspeaker environment.

18. A loudspeaker method, comprising:

inputting an audio signal to a first transmission line;

selectively processing the audio signal for each driver of a plurality of first drivers in a loudspeaker array, wherein selectively processing includes selectively delaying a first part of the audio signal for each of the plurality of first drivers;

inputting the audio signal to a second transmission line;

selectively processing the audio signal for each driver of a plurality of second drivers in a loudspeaker array, wherein selectively processing includes selectively delaying a second part of the audio signal for each of the plurality of second drivers; and asymmetrically acoustically outputting a sum of signals from the plurality of first drivers and the plurality of second drivers with a first acoustic output from the plurality of first drivers being tuned to a first volume in an acoustic environment and a second acoustic output from the plurality of second drivers being tuned to a second volume in the acoustic environment by the selectively delaying of the audio signal for the plurality of first drivers and the plurality of second drivers, wherein the first acoustic output has a narrower beam pattern that the second acoustic output.

19. The method of claim 18, wherein selectively processing the audio signal for each driver of a plurality of first drivers in a loudspeaker array includes switching first circuitry to control delay at each stage of the first transmission line; and selectively processing the audio signal for each driver of a plurality of second drivers in a loudspeaker array includes switching second circuitry to control delay at each stage of the second transmission line.

* * * * *